(12) United States Patent
Weiss et al.

(10) Patent No.: US 6,192,001 B1
(45) Date of Patent: Feb. 20, 2001

(54) INTEGRATED WEAK WRITE TEST MODE (WWWTM)

(75) Inventors: Donald R Weiss; John Wuu, both of Ft Collins; Reid James Riedlinger, Fort Collins, all of CO (US)

(73) Assignee: Hewlett-Packard Company, Palo Alto, CA (US)

( * ) Notice: Under 35 U.S.C. 154(b), the term of this patent shall be extended for 0 days.

(21) Appl. No.: 09/510,287

(22) Filed: Feb. 21, 2000

(51) Int. Cl.$^7$ .................................................. G11C 8/10
(52) U.S. Cl. ................... 365/230.06; 365/201; 365/226; 365/190
(58) Field of Search ................. 365/230.06, 201, 365/226, 190

(56) References Cited

U.S. PATENT DOCUMENTS 6,021,074 * 2/2000 Blish, II ........................ 365/200

* cited by examiner

*Primary Examiner*—Andrew Q. Tran

(57) ABSTRACT

The present invention integrates a WWTM circuit with the write driver circuitry, which is an inherent part of any conventional SRAM design. Thus, a circuit for writing data into and weak write testing a memory cell is provided. In one embodiment, the circuit comprises a write driver that has an output for applying a write or a weak write output signal at the memory cell. The write driver has first and second selectable operating modes. In the first mode, the write driver is set to apply a weak write output signal from the output for performing a weak write test on the cell. In the second mode, the write driver is set to apply a normal write output signal that is sufficiently strong for writing a data value into the cell when it is healthy.

19 Claims, 2 Drawing Sheets

INTEGRATED WEAK WRITE TEST MODE (WWWTM)

BACKGROUND

FIG. 1A shows a conventional static random access memory ("SRAM") cell 50, which is represented on a transistor level at 50A and on a more general gate level at 50B. On the transistor level, cell 50 includes PMOS transistors M1 and M2 and NMOS transistors M3 through M6. Transistors M1 and M3 are configured as a conventional inverter, which is shown as U2 in FIGURE 50B. Likewise, transistors M2 and M4 are configured as a conventional static inverter, which is shown as U1 in FIG. 50B. Inverter M1/M3 (U2) is cross-coupled with inverter M2/M4 (U1) to form the memory storage portion of cell 50. The input of inverter M2/M4 (U1), which is connected to the output of inverter M1/M3 (U2) provides a DATA storage node, and the input of inverter M1/M3 (U2), which is connected to the output of inverter M2/M4 (U1), provides a Not DATA storage node. Transistors M5 and M6 function as switches to control access to the DATA/Not DATA nodes from a differential BIT/Not BIT input. Their gates are connected to a Word Line ("WL") signal that when active (high) enables writing to and reading from the DATA/Not DATA memory cell nodes.

The two cross-coupled PMOS pull-up transistors, M1 and M2, retain a "1" value (at DATA, Not DATA) when written into the cell. These cross-coupled p-devices are designed to be strong enough to retain a 1 value in the cell indefinitely without any external refresh mechanism. However, if the P-devices are too weak due to a fabrication defect or a connection to either of the P devices is missing, the SRAM cell will no longer be able to hold its data indefinitely. The resulting fault in defective cell is referred to as a data retention fault (DRF) or a cell stability fault, depending on its severity. Thus, all SRAMs require some form of data retention and cell stability testing.

Traditionally, testing large static CMOS memory arrays for data retention faults (DRFs) and cell stability faults had been a time consuming and expensive effort. Test methods had also been partial in their test coverage. The algorithmic test methods used for detecting these faults were primarily functional in nature; that is they checked the cell stability or retention in a functional manner. These algorithmic test methods were time consuming and required extensive characterization of silicon to determine the worst case test conditions. Fortunately, improved test methodologies have been developed, which address these problems. One such test method is known as Weak Write Test Mode ("WWTM"). for additional information relating to weak write testing, as well as on more traditional methods, reference may be made to Meixner and Banik, *Weak Write Test Mode: An SRAM Cell Design Stability Design For Test Technique*, IEEE 0-78033540-6/96 (1996), which is hereby incorporated by reference into this specification.

A weak write test is active—in contrast to former tests, which were passive. A WWTM circuit actively attempts to weakly overwrite a cell. It is only capable of overwriting an unstable cell due to the presence of a defect. If the cell can be weakly overwritten, it is assessed to be defective, and if it cannot be weakly overwritten, it is deemed healthy. A weak write test can be used to test an array of memory in much less time than the former passive tests.

FIG. 1B shows a WWTM circuit 60 for testing SRAM cell 50. Weak write tests are implemented with a row of WWTM circuits attached to the bit line pairs of a memory array. WWTM circuit 60 generally includes a PMOS transistor Ma, an NMOS transistor Mb, and pass gate MOS devices Mc through Mf. Transistor Ma provides a high signal to a High node of the circuit 60. Conversely, transistor Mb provides a low signal (ground) to a Low node. The WWTM circuit 60 includes BIT and Not BIT outputs that are respectively connected across the BIT and Not BIT inputs of he SRAM cell 50. The BIT output is selectively connected to the High node through pass gate Mc and selectively connects the Low node through pass gate Mf. Alternatively, the Not BIT output is selectively connected to the High node through pass gate Md and selectively connected to the Low node through pass gate Me. A WR1 input is connected to the gates of Mc and Mf for selecting them in order to weak write a "1" (i.e., apply a weak "1") at the memory cell. Conversely, a WR0 input is connected to the gates of pass gates Md and Me for selecting them in order to weak write a "0" at the memory cell. Transistors Ma and Mb are sized so that circuit 60 is not strong enough to override the value in a healthy cell yet strong enough to override the value in a defective cell.

WWTM circuit 60 may be used for implementing a weak write test in the following manner. Initially, a background of "0"s are written into a memory cell array. The WWTM circuit 60 is enabled, and a weak write "1" is written to the array, word line by word line, for a preselected time. WWTM circuit 60 is then disabled, and the cells are read to determine if any cell has been overwritten. A background of solid "1"s are then written into the array. The WWTM circuit 60 is once again enabled, but this time, weak write "0"s are written to the cells word line by word line for a preselected time. Circuit 60 is disabled, and the cells are read. The cells that have been written over—either with "1"s or "0"s—are identified as being defective.

The preselected time for weak writing to a cell is longer than the time for a normal write operation. For example, in a weak write test mode, a weak write to a cell can occur from 20 to 50 times longer than a typical write cycle time. With the types of processors currently being designed, such required weak write testing time is still far shorter than the milliseconds or even seconds that were required with the previous passive methods.

In a typical arrangement, the WWTM circuit 60 is attached at the end of each SRAM cell column in a memory array. Unfortunately, the WWTM circuit is about 1.5 times the size of a normal memory cell 50. Thus, the area consumed by the WWTM circuits for a memory array is problematic. For example, with arrays having 32 rows in each column, the incorporation of WWTM circuits into memory arrays increases their required size by almost 5%. This is unacceptable in applications (e.g., microprocessor cache) where area is a critical issue.

Accordingly, what is needed is an improved scheme for implementing weak write testing.

SUMMARY OF THE INVENTION

These and other objects, features and technical advantages are achieved by a system and method which integrates a WWTM circuit with the write driver circuitry, which is an inherent part of any conventional SRAM design. Thus, a circuit for writing data into and weak write testing a memory cell is provided. In one embodiment, the circuit comprises a write driver that has an output for applying a write or a weak write output signal at the memory cell. The write driver has first and second selectable operating modes. In the first mode, the write driver is set to apply a weak write output signal from the output for performing a weak write test on the cell. In the second mode, the write driver is set to apply a normal write output signal that is sufficiently strong for writing a data value into the cell when it is healthy.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

Write driver circuits are used to write data into the cells of a memory array. Like conventional WWTM circuit, a write driver is normally operably connected to a column of cells across the BIT and Not BIT lines for differentially writing a value into a cell. The present invention takes advantage of the preexistence of a write driver for any memory array by incorporating into the already-existing driver the capability to also perform a weak write operation.

Figure 2:
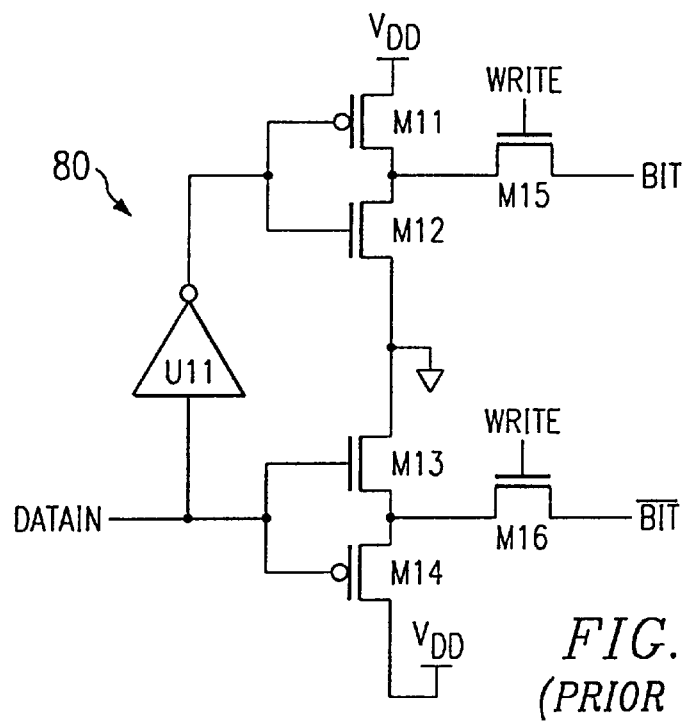
FIG. 2 shows a conventional write driver circuit.

FIG. 2 shows a conventional write driver circuit 80. Driver circuit 80 has BIT and Not BIT lines for connection to the corresponding BIT/Not BIT lines of a column of memory cells. It also has a DATAIN input, which receives a "0" or a "1" and causes it to be applied at the BIT/Not BIT outputs for writing to the memory cell column.

Write driver 80 generally includes PMOS transistors M11 and M14, NMOS transistors M12, M13, M15 and M16, and inverter U11. Transistors M11 and M12 are connected in a conventional static inverter gate configuration—as are M14 and M13—forming driver gates for providing the write driver output signal. The gates of the M11 and M12 FETs are jointly connected forming the input for the M11/M12 driver gate. Their drains are also jointly connected forming its output. Likewise, the gates of the M13 and M14 FETs are jointly connected forming the input for the M13/M14 driver gate, and their drains are jointly connected to form its output. The sources of M11 and M14 serve as the supply inputs for their respective driver gates. These supply inputs are connected to $V_{DD}$. Alternatively, the sources of M12 and M13 serve as the supply outputs for the driver gates. Accordingly, they are both connected to ground. Pass gate transistors M15 and M16 are connected between the outputs of the M11/M12 and M13/M14 driver gates on the one hand, and the BIT and Not BIT outputs on the other hand, respectively. Their gates are each connected to a WRITE signal for activating the write driver by passing the differential driver gate outputs to the BIT/Not BIT outputs. The DATA input node is at the input of the M13/M14 driver gate, and inverter U11 is connected between the DATA node and the input of the M11/M12 driver gate, which causes the driver gates to generate a differential output across their outputs.

In operation, when a "0" value is applied at the DATA node, the output of the M11/M12 driver gate (which is an inverter) is "0", and the output of the M13/M14 driver gate is "1". If the WRITE input is active (e.g., high), pass gates M15 and M16 turn on and pass these values through to the BIT and Not BIT outputs for differentially applying a "0" at a memory cell. Conversely, when a "1" is at the DATA input, a "1" (or high value) is generated at the M11/M12 driver gate output, and a "0" (low value) is generated at the M13/M14 driver gate output. If the WRITE input is active, pass gates M15 and M16 turn on to pass these values through to the BIT and Not BIT outputs for differentially applying a "1" at the memory cell.

Figure 3:
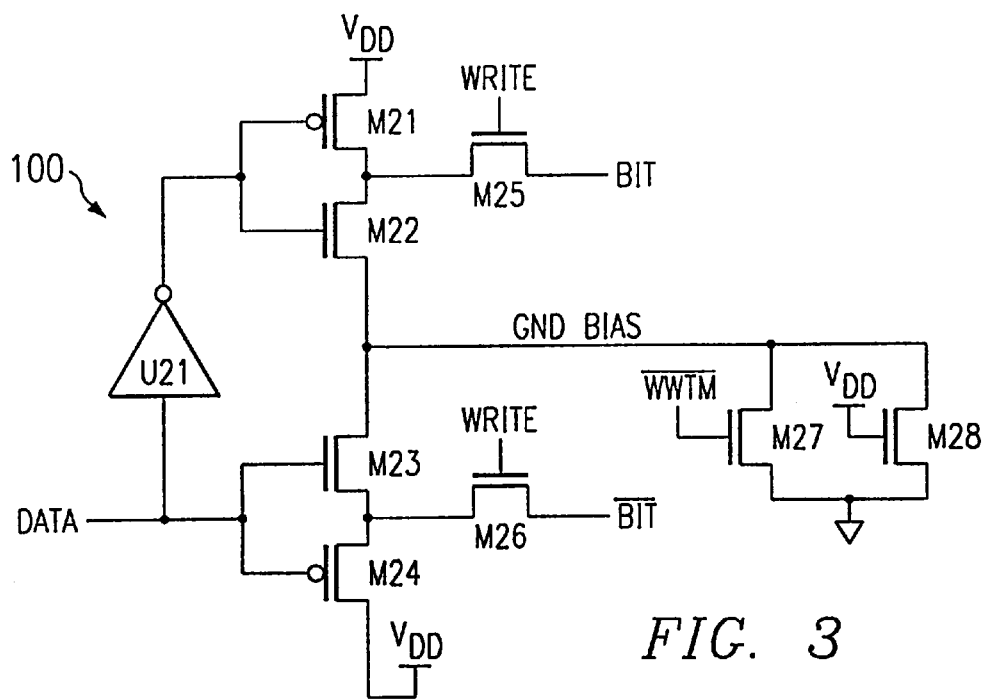
FIG. 3 shows one embodiment of a WWTM mode capable write driver of the present invention.

FIG. 3 shows one embodiment of a WWTM mode capable write driver circuit 100 of the present invention. Like Write Driver circuit 80, circuit 100 has DATA and WRITE inputs and BIT and Not BIT outputs for either writing a data value into or weak write testing a memory cell. Circuit 100 also has a Not WWTM input for setting circuit 100 either to WWTM or to normal write mode.

Write driver circuit 100 generally includes PMOS transistors M21 and M24, NMOS transistors M22, M23, and M25 through M28, and inverter U21. Transistors M21–M26 and inverter U21 are similarly arranged and function equivalently as their respective counterparts, M11–M16 and U11 from circuit 80. However, rather than being connected directly to ground, the supply outputs (M22 and M23 sources) of the driver gates (M21/22 and M23/M24) are connected to a BIAS node. Parallel configured first and second bias transistors, M27 and M28, are connected between the BIAS node and ground. The Not WWTM input is at the gate of the first bias transistor M27. In contrast, the gate of the second transistor, M28, is connected to $V_{DD}$ to keep M28 turned on.

Figure 1A:
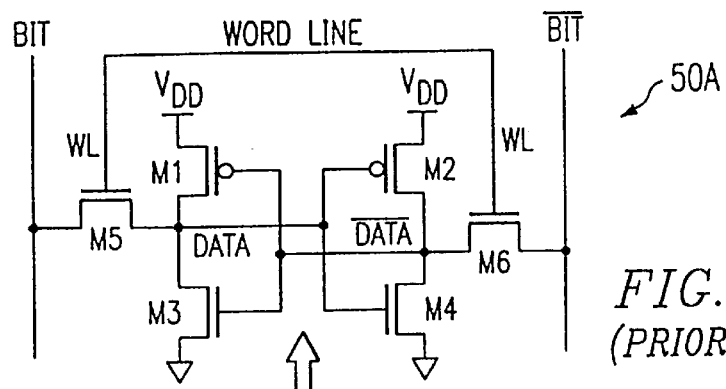
FIG. 1A depicts a conventional SRAM memory cell.
Figure 1B:
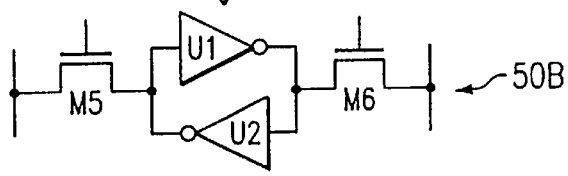
FIG. 1B shows a conventional weak write test circuit operably connected to the memory cell of FIG. 1A.
Figure 1B:
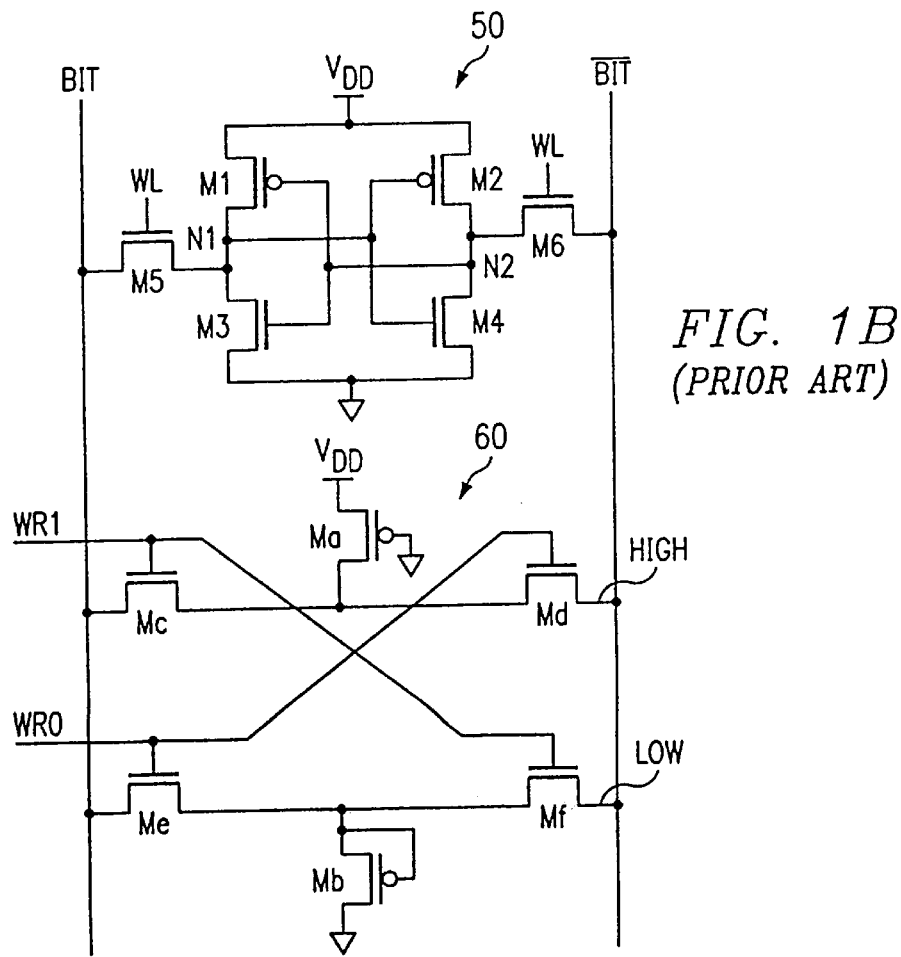

The amount of resistance between the BIAS node and ground proportionally affects the strength of the driver gates and thereby so affects the strength of the output signal at BIT/Not BIT for writing or weak write testing data into a memory cell. Accordingly, M28 is designed to be very weak because it will be the only pathway to ground from the BIAS node when driver 100 is in weak write mode. In this way, the output signal when in weak write mode is sufficiently weak for implementing a weak write test. M28 can have a value corresponding to that of the pull-down transistor, Mb, from FIG. 1B. Conversely, M27 is designed to be strong; it will be enabled when circuit 100 is in a normal write mode. In this way, the output signal is bolstered for the write mode when data is to be written into a healthy cell.

For a normal write operation, the Not WWTM input is active (high) so that both M27 and M28 are on. In this way, the BIT and Not BIT lines are pulled down strongly in order to perform a write operation. Alternatively, when the Not WWTM input is inactive (low), M27 is turned off and only the relatively weak M28 transistor remains on. This results in a weaker BIT/Not BIT output for performing a WWTM operation. The actual size of the strong first transistor, M27, is not so critical. It simply must be strong enough to allow circuit 100 to implement a write operation. However, the size of the second (WWTM) weak transistor, M28, should be selected or tweaked for a particular design so that the BIT/Not BIT signal is strong enough to write over data in a faulty cell but weak enough to not override data in a healthy cell. The actual size of M28 will vary from design to design depending upon the parameters of the particular circuit and associated memory array.

Persons of ordinary skill will recognize that any suitable devices for controllably changing the resistive path between the BIAS node and ground may be used. Such devices could include but are not limited to transistors, pass gates, resistors, current sources and combinations thereof. In addition, with use of a controllably variable resistive pathway (e.g., a removably selectable strong pathway in parallel with a nominal weak path) for controlling the drive strength of a driver gate(s) in a driver circuit, almost any write driver design can be modified to allow it to do both write and weak write test operations. This controllably variable pathway may be implemented in any suitable place within the circuit including within the supply input path, as well as within the supply output path.

The WWTM circuitry of circuit 100 adds only two additional NMOS transistors to the write driver of circuit 80. This is a negligible addition in terms of the whole array size. The design of circuit 100 takes advantage of the fact that Ma from WWTM circuit 60 does not nee to be rigorously sized. In fact, its function is the same as the function of the PMOS transistors in the write circuit 80, thus allowing the same PFET to be used in both purposes.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit for controlling a memory cell, said circuit comprising:
    a write driver having an output for operably applying an output signal at the memory cell; and wherein the write driver has first and second selectable operating modes, the first mode setting the write driver to apply a weak write output signal for performing a weak write test on the cell, and the second mode setting the write driver to apply a write output signal that is sufficiently strong for writing a data value into the cell when it is healthy.

2. The circuit of claim 1 wherein the write driver has first and second selectable resistive bias paths corresponding to the first and second modes, respectively.

3. The circuit of claim 2 wherein the second bias path is substantially stronger than the first bias path, whereby the second bias path is substantially less resistive than the first bias path.

4. The circuit of claim 3 wherein the first bias path is implemented between a bias node and a ground potential node with a weak transistor.

5. The circuit of claim 4 wherein the second bias path is implemented with an activated selectively removable strong transistor in parallel with the weak transistor.

6. A memory cell write driver comprising a first driver gate including:
    a first driver gate output for providing an output signal whose value is based on an input data value to be applied at the memory cell;
    a first supply node for powering the first driver gate, wherein the strength of the first driver gate output signal corresponds to the amount of power transferred between the first supply node and the first driver gate; and
    a controllably variable resistive path connected to the first supply node for controlling the amount of power transferred between the first supply node and the first driver gate, wherein the controllably variable resistive path has first and second settings, the first setting having a larger resistance than the second setting, wherein the first setting causes the driver gate to provide a weak write output signal, and the second setting causes the driver gate to provide a normal write output signal for writing the data value into a healthy memory cell.

7. The write driver of claim 6 wherein the first supply node is a power input node for providing the first driver gate with power.

8. The write driver of claim 7 wherein the controllably variable resistive path is connected between the first supply node and a voltage source.

9. The write driver of claim 6 wherein the first supply node is a ground bias node for channeling power out of the first driver gate.

10. The write driver of claim 9 wherein the controllably variable resistive path is connected between the first supply node and a ground potential node.

11. The write driver of claim 10 wherein the controllably variable resistive path comprises a turned on first relatively weak transistor in parallel with a selectably removable second transistor that is stronger than the first transistor, wherein the first setting corresponds to the second transistor being selected off, and the second setting corresponds to the second transistor being selected on.

12. The write driver of claim 6 wherein the first driver gate comprises a static inverter.

13. The write driver of claim 6 further comprising a second driver gate having a second driver gate output for providing an output signal whose value is based on the input data value, wherein the first and second driver gate outputs cooperate to provide a differential write driver output whose value corresponds to the input data value.

14. The write driver of claim 13 wherein the first and second driver gates are static inverters.

15. The write driver of claim 14 wherein the second driver gate has a first supply node that is connected to the first supply node of the first driver gate.

16. The write driver of claim 15 wherein the first supply nodes define a ground bias node, the controllably variable resistive path being connected between said ground bias node and a ground potential node.

17. A method of performing a weak write test on a memory cell with a write driver having an output that is operably connected to the memory cell, comprising the steps of:
    setting the write driver to a first mode so that a normal write output signal for writing to a healthy cell is generated at the output;
    writing a first value into the memory cell from the output;

setting the write driver to a second mode so that a weak write signal is generated at the output;

weak writing a second value from the output to the memory cell; and reading the value in the memory cell, wherein the memory cell is assessed as being defective if its value is not the first value.

18. The method of claim 17 wherein the act of setting the write driver to a first mode includes enabling a strong transistor for increasing the power of the write driver.

19. The method of claim 18 wherein the act of setting the write driver to a second mode includes disabling said strong transistor.

* * * * *